(12) United States Patent
Faure et al.

(10) Patent No.: US 7,736,935 B2
(45) Date of Patent: Jun. 15, 2010

(54) PASSIVATION OF SEMICONDUCTOR STRUCTURES HAVING STRAINED LAYERS

(75) Inventors: Bruce Faure, Paris (FR); Pascal Guenard, Froges (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 2 days.

(21) Appl. No.: 12/341,806

(22) Filed: Dec. 22, 2008

(65) Prior Publication Data
US 2010/0035418 A1 Feb. 11, 2010

(51) Int. Cl.
H01L 21/02 (2006.01)
(52) U.S. Cl. ............................ 438/59; 438/60; 438/62; 438/458; 438/795; 257/E33.001; 257/E33.034
(58) Field of Classification Search ............. 438/55–62, 438/458–462, 623, 795; 257/E33.001, E33.034
See application file for complete search history.

(56) References Cited

U.S. PATENT DOCUMENTS

| | | | | |
|---|---|---|---|---|
| 4,994,867 | A | 2/1991 | Biegelsen | 357/16 |
| 5,391,257 | A | 2/1995 | Sullivan et al. | 156/630 |
| 6,214,733 | B1 | 4/2001 | Sickmiller | 438/691 |
| 6,794,276 | B2 | 9/2004 | Letertre et al. | 438/506 |
| 7,018,909 | B2 | 3/2006 | Ghyselen et al. | 438/455 |
| 7,273,798 | B2 | 9/2007 | Lester et al. | 438/458 |
| 7,282,381 | B2 | 10/2007 | Feltin et al. | 438/46 |
| 2003/0064535 | A1 | 4/2003 | Kub et al. | 438/22 |
| 2004/0192067 | A1 | 9/2004 | Ghyselen et al. | 428/763 |
| 2004/0253792 | A1 | 12/2004 | Cohen et al. | 438/400 |
| 2005/0250294 | A1 | 11/2005 | Ghyselen et al. | 438/458 |
| 2006/0128117 | A1 | 6/2006 | Ghyselen et al. | 438/455 |
| 2006/0175608 | A1* | 8/2006 | Celler | 257/49 |
| 2006/0205180 | A1 | 9/2006 | Henley et al. | 438/458 |
| 2006/0211219 | A1 | 9/2006 | Henley et al. | 438/458 |
| 2007/0048975 | A1 | 3/2007 | Chen et al. | 438/478 |
| 2007/0069225 | A1* | 3/2007 | Krames et al. | 257/94 |
| 2007/0072324 | A1 | 3/2007 | Krames et al. | 438/46 |

(Continued)

FOREIGN PATENT DOCUMENTS

EP 0651439 5/1995

(Continued)

OTHER PUBLICATIONS

Hobart, K.D. et al., "Compliant Substrates: A Comparative Study of the Relaxation Mechanisms of Strained Films Bonded to High and Low Viscosity Oxides", Journal of Electronic Materials, vol. 29, No. 7, pp. 897-900 (2000).

(Continued)

*Primary Examiner*—Michael S Lebentritt
(74) *Attorney, Agent, or Firm*—Winston & Strawn LLP

(57) ABSTRACT

The present invention provides, in part, methods producing multilayer semiconductor structures having one or more at least partially relaxed strained layers, where the strained layer is at least partially relaxed by annealing. In particular, the invention forms diffusion barriers that prevent diffusion of contaminants during annealing. The invention also includes embodiments where the at least partially relaxed strained layer is patterned into islands by etching trenches and the like. The invention also provides semiconductor structures resulting from these methods, and further, provides such structures where the semiconductor materials are suitable for application to LED devices, laser devices, photovoltaic devices, and other optoelectronic devices.

15 Claims, 2 Drawing Sheets

U.S. PATENT DOCUMENTS

| | | | |
|---|---|---|---|
| 2007/0241353 A1* | 10/2007 | Taki | 257/94 |
| 2007/0278622 A1 | 12/2007 | Lester et al. | 257/615 |
| 2007/0298549 A1 | 12/2007 | Jurczak et al. | 438/149 |
| 2008/0113496 A1 | 5/2008 | Keller et al. | 438/481 |
| 2008/0169483 A1* | 7/2008 | Kasai et al. | 257/183 |
| 2009/0050917 A1* | 2/2009 | Nakagawa et al. | 257/98 |

FOREIGN PATENT DOCUMENTS

| | | |
|---|---|---|
| EP | 0 858 110 A1 | 8/1998 |
| EP | 1 671 361 B1 | 4/2007 |
| EP | 1901345 | 3/2008 |
| FR | 2775121 | 8/1999 |
| FR | 2895420 | 6/2007 |
| FR | 2895562 | 6/2007 |

OTHER PUBLICATIONS

L. Di Cioccio et al., "III—V Layer Transfer Onto Silicon and Applications", Phys. Stat. Sol., vol. (a) 202, No. 4, pp. 509-515 (2005).

M. Kostrzewa et al, "Feasibility of Strain Relaxed InAsP and InGaAs Compliant Substrates", pp. 437-440 (2003).

P. M. Mooney et al., "Elastic Strain Relaxation in Free-Standing SiGe/Si Structures", Applied Physics Letters, vol. 84, No. 7, pp. 1093-1095 (2004).

Haizhou Yin et al., "Buckling Suppression Of SiGe Islands On Compliant Substrates", Journal of Applied Physics, vol. 94, No. 10, pp. 6875-6882 (2003).

Haizhou Yin et al., "Strain Relaxation Of SiGe Islands On Compliant Oxide", Journal of Applied Physics, vol. 91, No. 12, pp. 9716-9722 (2002).

Haizhou Yin et al., "Tunable Uniaxial Vs Biaxial In-Plane Strain Using Compliant Substrates", Applied Physics Letters, vol. 87, pp. 061922-1-061922-3 (2005).

R. Huang et al., XP009112211, "Mechanics Of Relaxing SiGe Islands On A Viscous Glass," Acta Mechanica Sinica (English Series), vol. 18, No. 5, pp. 441-456 (2002).

European Search Report for EP08290757.7 dated Mar. 16, 2009.

Haizhou Yin et al., "Fully-depleted Strained-Si on Insulator NMOSFETs without Relaxed SiGe Buffers", IEDM International Electron Devices Meeting, pp. 03-53-03-56 (2003).

C. X. Peng et al., "Influence of GaN polarity and intermediate-temperature buffer layers on strain relaxation and defects", PHYSICA Bvol.391, No. 1, pp. 6-11 (2007).

European Search Report for EP 08 29 0759 dated Apr. 14, 2009.

* cited by examiner

PASSIVATION OF SEMICONDUCTOR STRUCTURES HAVING STRAINED LAYERS

FIELD OF INVENTION

The present invention relates to the field of semiconductor material processing; in particular, the invention relates to passivation of etched portions of multilayer semiconductor structures such as portions of buried layers exposed by etched trenches. Multilayer structures passivated according to the invention are useful and suitable for fabrication of electronic, optic, photovoltaic, and optoelectronic devices, e.g., for the fabrication of LEDs and lasers.

BACKGROUND OF THE INVENTION

The technology of the manufacture of semiconductor devices comprises a great variety of etching processes used for forming trenches and similar structures in multilayer stacks of semiconductor and insulator materials. Integrated circuits are typically comprised of a large number of circuit elements located on a given chip area according to a specified circuit layout, wherein in complex circuits the field effect transistor represents one predominant circuit element. Generally, a plurality of process technologies are currently practiced, wherein for complex circuitry based on field effect transistors, such as microprocessors, storage chips, and the like, CMOS technology is currently one of the most promising approaches due to the superior characteristics in view of operating speed and/or power consumption and/or cost efficiency of the resulting devices. During the fabrication of complex integrated circuits using CMOS technology, etching of trenches is commonly performed.

Among other procedural steps heat treatment of semiconductor component at different fabrication states has to be performed in various environments. Annealing processes that alter the microstructure of a (semiconductor) material causing changes in physical properties such as the conductivity, strength and hardness are commonly known. In the manufacture of small-sized transistors annealing may be included in an attempt to provide tensile or compressive strains to channel regions in order to enhance the performance of the transistors. In the context of compliant substances facilitating the employment of strained thin films hetero-epitaxially grown on some seed substrate, etched trenches can be provided for facilitating partial or complete relaxation of the strained thin films.

However, in trenches and similar etched structures, the bottom and side surfaces include portions of material layers of the etched multilayer stack that are exposed to the environment after the etching process was completed. When such etched components are subject to some heat treatment constituents of these material layers can diffuse from the exposed portions out to the environment. The diffusion can severely affect the subsequent manufacturing steps and performance of finished semiconductor devices due to contamination of the annealing environment and the resulting contamination of both already formed layers and structures and those structures being formed during the annealing process.

In the manufacture of InGaNOS devices with relaxed strained InGaN layers, for example, the formation of strained material InGaN islands facilitates the relaxation of the strained layer. The formation of the islands is achieved by etching trenches separating portions of the strained layer. Relaxation is initiated by a heat treatment of the islands that are formed above some compliant layer, e.g., comprising borophosphosilicate glass (BPSG). The heat treatment results in a plastic deformation of the BPSG layer and some reflow thereby elastically relaxing the strained InGaN layer. During the heat treatment, however, boron and phosphorous atoms diffuse out of the portions of the BPSG material that are exposed at the walls and bottoms of the above-mentioned trenches. If the heat treatment is performed in an epitaxial reactor before or during the growth of an active layer, the diffused atoms contaminate the reactor atmosphere and the growing layer and thus affect performance of the built active layer.

It is thus a problem underlying the present invention to provide means to avoid diffusion of material portions of buried layers exposed by etched structures at the inner walls and the bottoms of trenches etched in multilayer stack arrangements.

SUMMARY OF THE INVENTION

The present invention provides methods for passivation of buried layers, e.g., a buried oxide layer such as a glass. Buried layers can be useful for relaxation of a strained layer of a semiconductor material prior to device fabrication.

In preferred embodiments, the method relates to passivation of semiconductor structures and includes providing a first material layer, then forming a second material layer that is to be patterned above the first material layer, then forming a diffusion barrier layer between the second material layer and the first material layer thereby forming a multilayer stack, and finally, patterning, in particular, by etching, the second material layer down to, but not completely through, the diffusion barrier layer and without exposing portions of the first material layer so that diffusion of material from the first material layer through the diffusion barrier layer during subsequent heat treatment is substantially prevented. Optionally, the multilayer stack can be subjected to a heat treatment. The patterning of the second material layer can be performed by etching trenches or similar structures. Whereas the etching may remove material of the diffusion barrier layer in addition to parts of the second material layer, it is essential that the diffusion barrier layer not be completely etched through (or breached), i.e., that the diffusion barrier layer continues to completely cover the etched structures.

In particular, in the context of the manufacture of InGa-NOS (InGaN on silicon) structures that are useful for the production of LEDs and solar cells, for instance, heat treatment for partial or complete relaxation of strained InGaN layers that are hetero-epitaxially grown on a GaN seed layer and transferred to a support substrate is a crucial step in the process line. The quality of epitaxially formed layers on the surface of the relaxed strained InGaN layers can be heavily affected by diffused constituents of the compliant material used for the relaxation. The provision of the diffusion barrier layer in accordance with the present invention solves the problems caused by such diffusion. It should be noted that, although InGaN is frequently used to exemplify the present invention, the invention is not limited to this material, and in fact, the strained material layer may, for instance, comprise or consist of a one or more Group III-nitride material chosen from a binary, ternary or quaternary alloy.

In further preferred embodiments, method of the invention for passivation of a semiconductor structure include first, providing a multilayer stack having a buried layer formed below a second material layer (in particular, a surface layer) of the multilayer stack, and then, patterning, in particular, by etching, the surface of the multilayer stack through the second material layer thereby exposing portions of the at least one buried layer; and finally, depositing a diffusion barrier layer (at least) on the exposed portions of the buried layer such that diffusion of material from the buried layer through the diffusion barrier layer during a subsequent heat treatment of the multilayer stack is substantially prevented. Optionally, the multilayer stack can be subjected to a heat treatment.

Additional features and advantages of the present invention will be described with reference to the drawings. In the description, reference is made to the accompanying figures that are meant to illustrate preferred embodiments of the invention. It is understood that such embodiments do not represent the full scope of the invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

Figure 1:
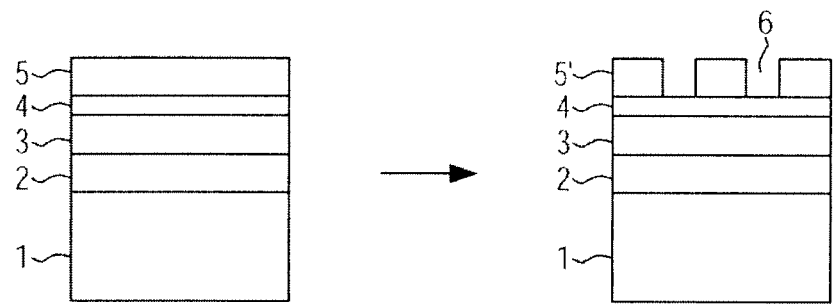
FIG. 1 illustrates exemplary steps of an embodiment of the methods and structures of the inventions.

The material of the diffusion barrier layer is chosen such that in a subsequently performed heat treatment of the semiconductor structure no or substantially no diffusion of constituents (atom, molecules, and so forth) of the first material layer from the etched structures is possible. The choice of the material of the diffusion barrier layer may particularly depend on the diffusion coefficients of the constituents of the first material layer and the temperatures involved in the heat treatment process.

By the provision of the diffusion barrier layer contamination of the environment during the heat treatment, e.g., an annealing atmosphere generated in some processing reactor, can be prevented. For example, in annealing of the semiconductor structure in an epitaxial reactor used for epitaxially growing a semiconductor, contamination of the grown layer by diffused atoms of the first material layer is limited or substantially prevented. The diffusion barrier layer may advantageously be deposited not only on the surfaces of the of the patterned second material layer, but also on side surfaces of the multilayer stack where the one or more buried layers are exposed. Thereby, diffusion of constituents of the first material can be limited or prevented not only from patterned trench-like structures (interspaces) but also from the side surfaces of the multilayer stack.

After, e.g., annealing steps, the diffusion barrier layer is often removed, for example, by selective etching or chemical-mechanical polishing (CMP). In particular, patterning of the second material layer may involve etching trenches through the second material layer that extend to the buried layer, in which case portions of the diffusion barrier layer are removed such that the diffusion barrier layer only remains on the bottoms and/or walls of the trenches, or such that the diffusion barrier layer only remains on the bottoms of the trenches and/or on those portions of the walls and the side surfaces of the multilayer stack where buried layers are exposed. If the patterning results in trenches separating islands, removal by etching is preferred.

Diffusion barrier layers are particularly advantageous where at least partially relaxed strained material layers are formed and subsequently used for epitaxial growth of further layers for the actual fabrication of electronic and opto-electronic devices are. Accordingly, further embodiments of the invention provide methods for passivation of a semiconductor structure that include, first, providing a first material layer that is a low-viscosity layer, in particular, a buried oxide layer or a buried polymer layer, made of a compliant material and, in particular, bonded to a support substrate, and then, forming at least one second material layer that is to be patterned above the first material layer to form a multilayer stack, wherein the second layer is a strained material layer, in particular, a material previously grown on a seed substrate and transferred to the support substrate by means of the first material layer, and then forming a diffusion barrier layer between the second material layer and the first material layer, and then, patterning the second material layer down to, but not completely through, the diffusion barrier layer and without exposing portions of the first material layer leaving sufficient material so that diffusion from the first material layer through the diffusion barrier layer during a subsequent heat treatment of the multilayer stack is limited or substantially prevented, and finally, heat treatment in order to at least partly relax the strained material islands. During heat treatment, diffusion of compliant material out of the multilayer stack is substantially limited prevented by the diffusion barrier layer. Patterning can include etching trenches in the strained material layer to form strained material islands; and In more detail, one or more of the buried layers can advantageously be a low-viscosity layer, in particular, a buried layer of a compliant oxide material, that is bonded to a support substrate. The second material layer can advantageously be a strained material layer, in particular, a material layer previously grown on a seed substrate and then transferred to the support substrate by means of the first material layer. Patterning advantageously comprises etching trenches in the strained material layer to form strained material islands. The diffusion barrier layer is advantageously deposited at least on the exposed portions of the buried layer so that the barrier layer is also partially etched during patterning. The diffusion barrier can also be deposited before etching, and then etching then controlled so that the surfaces of the at least partially relaxed strained islands are exposed without exposing portions of the compliant layer such that no diffusion of elements occurs during heat treatments performed during subsequent portions of a process (e.g., during epitaxy of active layers performed on the islands). Finally, heat treatment is performed to at least partly relax the strained material islands. During the heat treatment, diffusion of compliant material or its components out of the multilayer stack is limited or substantially prevented by the diffusion barrier. The diffusion barrier can also be deposited after the relaxation step of the strained material islands.

The above-mentioned low-viscosity layers are termed low-viscosity in order to indicate compliance and deformation ability. For example, they can comprise material with a glass transition temperature (Tg) between 500 and 950° C. Most of undoped dioxide materials have for example a Tg above this range, e.g., above about 1200° C. However, the low viscosity layer can in particular, be a buried oxide layer further including boron or phosphorous or a buried polymer layer. For example, the low viscosity can comprise or consist of a boro-phosphosilicate glass (BPSG). Reliable relaxation of strained material islands of InGaN can be achieved when the compliant, low-viscosity material is a typical BPSG glass comprising about 4.5% by weight of boron and about 2% by weight of phosphorous. Less than 4% by weight of boron is preferred so that the compliant layer posses sufficient mechanical rigidity at temperatures (e.g., 800° C.) involved in epitaxy that is often perform on the relaxed strained material further down the process line.

Experiments have proven that diffusion of boron and/or phosphorous can effectively be suppressed at such temperatures when the diffusion barrier layer comprises or consists of silicon dioxide SiO2 (with no boron or phosphorus species) or SiN in particular $Si_xN_y$:H or $Si_3N_4$. According to an example, the diffusion barrier layer (e.g., a diffusion barrier layer comprising or consisting of SiO2 or SiN in particular $Si_xN_y$:H or $Si_3N_4$) is deposited at a thickness of 10 nm to 3 micrometer, in particular, 10 nm to 200 nm, in order to prevent diffusion of constituents, e.g., boron or phosphorus, from the first material layer, The invention also provides semiconductor structures in which a multilayer stack has a buried layer formed below a second material layer, both the buried layer and the second material layer being patterned, and a diffusion barrier layer deposited at least on the portions of the at least one buried layer exposed by the patterning. In preferred embodiments, the second material layer is a strained material that has been at least partial relaxed by a heat treatment. Also, in addition to an at least partly relaxed strained material layer above a patterned buried layer, a diffusion barrier layer is preferably deposited at least on the portions of the buried layer that have been exposed by the patterning. The invention also includes structures having an (electronically) active layer(s) on the at least partially relaxed strained material that is suitable for the fabrication of LED, laser or photovoltaic devices.

The invention also includes the following ones among the numerous applications of the provided methods and structures. In one such preferred embodiment, the invention is provides methods for the manufacture of semiconductor devices in which, beginning with a semiconductor structure that has been formed and passivated according to one of the above passivation methods, a further material layer is epitaxially grown on the formed at least partially relaxed strained material, in particular, at least partially relaxed strained material islands. In particular, the further material layer is grown by homo-epitaxy. Alternatively, the at least partially relaxed strained material can be transferred to another substrate before epitaxy. For example, in the case of partially or completely relaxed strained InGaN islands, a free Ga-polarity face is obtained on which (homo)epitaxial growth can easily be carried out. To avoid double-transfer (to expose the Ga-polarity (or Group III-element-polarity) face, the strained InGaN layer can also be transferred directly from the N-polarity face of a donor substrate so as to bond with the N-face of the substrate and to free the Ga face of the InGaN layer for subsequent steps.

U.S. patent application Ser. No. 12/341,722), titled "METHODS AND STRUCTURES FOR RELAXATION OF STRAINED LAYERS", by Fabrice LETERTRE and Carlos MAZURE, and assigned to the assignee of the present application is incorporated herein by reference in its entirety for all purposes.

U.S. patent application Ser. No. 12/341,852, titled "METHODS FOR RELAXATION AND TRANSFER OF STRAINED LAYERS AND STRUCTURES FABRICATED THEREBY", by Pascal GUENARD, Bruce FAURE, Fabrice LETERTRE, Michael R. KRAMES, and Nathan F. GARDNER, and assigned to the assignee of the present application is incorporated herein by reference in its entirety for all purposes.

The preferred embodiments and particular examples described herein are directed to passivating a compliant material that has been provided to promote the partial or complete relaxation of a strained material layer during heat treatment. These should be seen as examples of the scope of the invention, but not as limiting the present invention, as a skilled person will appreciate that generalization to other multilayer structures is straightforward.

FIG. 1 illustrates multilayer stack structure 51, a preferred embodiment formed according to the methods of the invention. Multilayer stack structure 51 has support substrate 1, first borophosphosilicate glass (BPSG) layer 2, second BPSG layer 3, diffusion barrier layer 4, and strained InGaN (or other Group III-nitride or mixed Group III-nitride) layer 5 with a free (upper) Ga-polarity face. Multilayer stack 51 can be formed by the following three step process.

First, an InGaN layer and a diffusion barrier layer are detached and transferred from an InGaN source substrate. In particular, starting with an InGaN donor substrate having a free face with N-polarity, diffusion barrier layer 4 is deposited on the N-polarity free face of InGaN donor substrate. The diffusion barrier layer preferably comprises $Si_3N_4$. Next, strained InGaN layer 5 along with diffusion barrier layer 4 is transferred (after splitting or separation) from the N-polarity face of the donor substrate. Optionally, diffusion barrier layer 4 can be deposited on the N-polarity face of InGaN layer 5 and separation and transfer from the donor substrate. Subsequently, second BPSG layer 3 is deposited atop of diffusion barrier layer 4. Then, first BPSG layer 2 is deposited on support substrate 1 in order to promote bonding to the second BPSG layer 3 atop diffusion barrier layer 4. Then, strained InGaN layer 5 (along with barrier layer 4 and BPSG layer 3) is bonded to BPSG layer 2 on source substrate 1 forming structure 51. As a result of these first steps, the N-polarity face of InGaN layer 5 is now buried within structure 51 while the Ga-polarity is exposed on the surface of structure 51.

Next, the strained InGaN layer 5 is patterned by etching trenches 6 in the surface of structure 51 thereby forming structure 52. Trenches 6 divide the strained InGaN layer into strained InGaN islands 5', and are etched down to but not completely through diffusion barrier layer 4. The etching can be stopped, e.g., as soon as material of the diffusion barrier layer 4 is detected in the etching atmosphere or a significant change in the etching rate is determined. Thus, first BPSG layer 2 remains covered by material of second BPSG layer 3. Finally, multilayer stack 53, with patterned strained InGaN layer 5 on its surface, is subject to heat treatment selected to promote sufficient reflow (plastic deformation, viscous flow, or the like) of at least the second BPSG layer 3 in order that strained InGaN islands 5' are at least partially relaxed. Importantly, because of diffusion barrier layer 4, no constituents (e.g., B or P) of first and second BPSG layer 2 and 3 can diffuse into the annealing atmosphere during the heat treatment process. However, if such diffusion occurred, contamination of subsequently grown layers is likely.

Although the passivation process of this embodiment is generally fast and simple, the diffusion barrier layer between compliant second BPSG layer 3 and the strained InGaN islands 5' may affect the relaxation process. In particular, the diffusion barrier layer may hinder complete relaxation of the strained InGaN islands.

Figure 2:
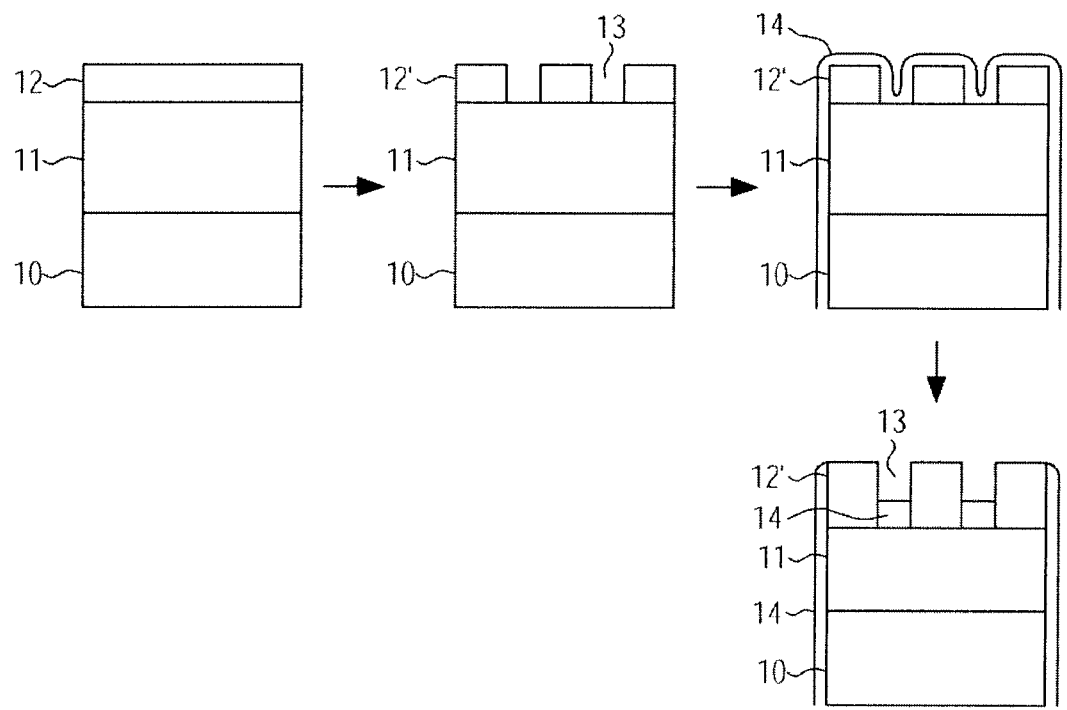
FIG. 2 illustrates exemplary steps of a further embodiment of the methods and structures of the inventions.

FIG. 2 illustrates multilayer stack structure 55, a further preferred embodiment formed according to the methods of the invention. Multilayer stack structure 55 support substrate 10, a BPSG layer 11 and a strained InGaN layer 12. This stack structure can also be formed by transfer of strained InGaN layer 12 from a seed substrate to the support substrate 10.

Next, multilayer stack structure 57 is formed by patterning strained InGaN layer 12 by etching (or otherwise creating) trenches 13 which separate strained InGaN islands 12'. The trenches can also be etched or formed into compliant layer 11. Next, multilayer stack structure 59 is formed by depositing diffusion barrier layer 14, preferably comprising Si3N4, on the strained InGaN islands 12', in the trenches 13, at least on the trench walls of the compliant layer 11 and at the side surfaces on the multilayer stack.

Next, a photolithography step is performed in order to partly remove the material of the diffusion barrier layer 14 such that this diffusion barrier layer 14 is maintained on the side surfaces of the multilayer stack, at the trench walls of the compliant layer 11 and in the lower part of the trenches 13 as shown in FIG. 2. Whereas this example includes the additional step of photolithography, it provides the advantage that relaxation of the strained InGaN islands 12' by subsequent heat treatment is not significantly hindered by the diffusion barrier layer 14, in particular, since the strained InGaN islands 12' are in direct contact with the compliant BPSG layer 11 that causes the relaxation by reflow during the heat treatment. Moreover, relaxation of the strained InGaN islands 12' is improved by removing the diffusion barrier layer 14 from the upper surface of these islands. Similar to the example described with reference to FIG. 1 diffusion of constituents of the BPSG layer 11, in particular, of boron or phosphorous atoms, during the heat treatment is prevented by the diffusion barrier layer 14.

Figure 3:
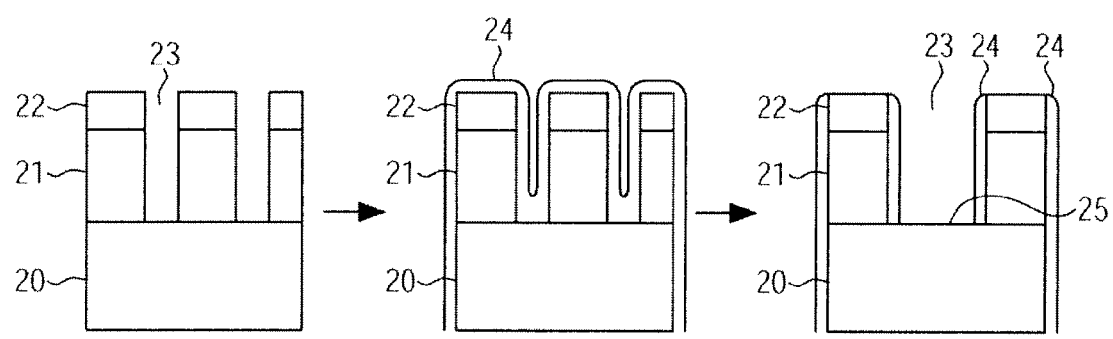
FIG. 3 illustrates exemplary steps of a further embodiment of the methods and structures of the inventions.

FIG. 3 illustrates another example of the herein disclosed passivation method. A stack comprising a support substrate 20 and a BPSG layer 21 as well as a strained InGaN layer 22 similar to the stack shown in FIG. 2 is provided and trenches 23 are etched through the BPSG layer 21 and the strained InGaN layer 22. A diffusion barrier layer 24 consisting of Si3N4 is deposited on the remaining BPSG layer 21 and strained InGaN layer 22, in the trenches 23 and at the side surfaces of the multilayer stack as shown in FIG. 3. Subsequently, anisotropic dry etching is performed in order to remove material of the diffusion barrier layer 24 from the top of the remaining parts of the patterned strained InGaN layer 22 and from the bottoms 23 of the trenches 23. The inner walls of the trenches remain covered by the diffusion barrier layer 24. Since the etching of trenches was only stopped at the support substrate 20, no diffusion of boron or phosphorous atoms during subsequent annealing for relaxation of the strained InGaN layer 22 occurs.

In the examples described above with reference to FIGS. 1 to 3, an SiO2 layer or undoped silicon glass of thickness of about 50 nm, for instance, may be deposited on the InGaN layer before the deposit of the BPSG in order to improve adherence of the BPSG layer to the InGaN layer. The BPSG layers of FIG. 1 or the BPSG layer of FIGS. 2 and 3 may have a thickness of about 500 nm and may comprise 4-5% of weight boron and 2% of weight of phosphorous. The InGaN layer may have a thickness of about 100 nm and may comprise 5-7% of molar mass indium.

The deposition of the diffusion barrier layer (see reference sign 4 in FIG. 1 and reference signs 14 and 24 in FIGS. 2 and 3, respectively) at a thickness of, e.g., 10 to 200 nm, can be performed by any deposition method known in the art, for instance, by low-pressure plasma enhanced chemical vapor deposition (LPCVD) or plasma enhanced chemical vapor deposition from metal organic compounds (PECVD).

The at least partially relaxed strained (InGaN) islands can be used for epitaxy of a layer that is useful for the formation of a semiconductor device or solar cells. The at least partially relaxed strained islands may be transferred to another substrate such that they show a free Ga face on which (homo) epitaxy, e.g., of an InGaN layer, can be carried out. Alternatively, the face of nitrogen polarity of the hetero-epitaxially grown strained InGaN layer may directly be transferred to the support substrate to obtain a relaxed free face of gallium polarity for the subsequent epitaxy process. Obviously, an InGaN structure with a free face of gallium polarity might also be obtained, if it is desired.

It should be noted that trenches might be formed through the strained layer and the compliant layer down to the support substrate without the formation of any diffusion barrier in order to decrease the out diffusion. In this case, out diffusion can only occur at the trench walls, since the bottoms of the trenches are free of the material of the compliant layer. However, provision of the diffusion barrier layer represents the most efficient way of preventing out diffusion of material portions of buried layers.

The preferred embodiments of the invention described above do not limit the scope of the invention, since these embodiments are illustrations of several preferred aspects of the invention. Indeed, various modifications of the invention in addition to those shown and described herein, such as alternate useful combinations of the elements described, will become apparent to those skilled in the art from the subsequent description. Such modifications are also intended to fall within the scope of the appended claims. In this application, headings and legends are used for clarity and convenience only. A number of references are cited herein, the entire disclosures of which are incorporated herein, in their entirety, by reference for all purposes. Further, none of the cited references, regardless of how characterized above, is admitted as prior to the invention of the subject matter claimed herein. Also, the words "including", "comprising", "having", and "with" as used herein are to be interpreted broadly and comprehensively and are not limited to any physical interconnection. The articles "a" or "an" or the like are also to be interpreted broadly and comprehensively as referring to both the singular and the plural.

What is claimed is:

1. A method for passivation of a semiconductor structure comprising:
    forming a multilayer stack comprising a support substrate, a layer of a first material, and an at least partially exposed layer of a second material overlying the first material layer;
    patterning the multilayer stack so that the second material layer becomes divided into a plurality of islands; and
    passivating the multilayer stack by forming a diffusion barrier layer that covers all exposed portions of the first material layer while leaving exposed at least the top surfaces of the islands of the second material layer.

2. The method of claim 1 wherein the diffusion barrier layer comprises SiN or $SiO_2$.

3. The method of claim 1 wherein the thickness of the diffusion barrier layer is 10 to 200 nm.

4. The method of claim 1 which further comprises depositing the diffusion barrier layer on those portions of the side surfaces of the multilayer stack where the first layer is exposed.

5. The method of claim 1 wherein the first material layer is bonded to a support substrate.

6. The method of claim 1 wherein the passivating is such that, during a subsequent heat treatment of the multilayer stack, diffusion of material from the first material layer through the diffusion barrier layer is substantially prevented.

7. The method of claim 1 wherein the forming of the multilayer stack further comprises:

growing the second material layer on a seed substrate;
depositing at least part of the first material layer on the second material layer; and
transferring the first and second material layers to a support substrate.

8. The method of claim 1 wherein the patterning comprises etching trenches through the entire thickness of the second material layer so as to extend at least to the directly underlying the second material layer.

9. The method of claim 1 which further comprises forming the diffusion barrier layer between the first and the second material layers; and patterning the second material layer down to, but not completely through, the diffusion barrier layer such that no portions of the first material layer become exposed.

10. The method of claim 1 which further comprises patterning the second material layer through its entire thickness so that portions of the first material layer become exposed; and the passivating includes forming the diffusion barrier layer to cover the now-exposed portions of the first material layer.

11. The method of claim 10 which further comprises removing portions of the diffusion barrier layer so that the surfaces of the islands of the second material become exposed, while the portions of the first material layer at the side walls of the islands, between the islands, and at the side surfaces of the multilayer stack remain covered.

12. The method of claim 1 wherein the first material layer comprises a low-viscosity compliant material, and wherein the second material layer comprises a strained semiconductor material, and which further comprises performing a heat treatment so as to at least partly relax the strained material islands, while diffusion from the first material layer and out of the multilayer stack is substantially prevented by the diffusion barrier.

13. The method of claim 12 wherein the low-viscosity compliant material comprises one of a compound or mixture comprising $SiO_2$ and boron, a compound or mixture comprising $SiO_2$ and phosphorous, and a borophosphosilicate glass and the strained semiconductor material comprises a Group III-nitride material or a binary, ternary or quaternary alloy of a Group III-nitride material.

14. The method of claim 13 wherein at least part of the exposed face of the strained, second material layer has Group III element polarity.

15. The method of claim 12 which further comprises epitaxially growing a layer of a further material on the surfaces of at least one of the partially relaxed islands of strained semiconductor material, wherein the further material comprises a semiconductor suitable for fabrication of LED devices, laser devices, or photovoltaic devices.

* * * * *

UNITED STATES PATENT AND TRADEMARK OFFICE
CERTIFICATE OF CORRECTION

PATENT NO. : 7,736,935 B2 Page 1 of 1
APPLICATION NO. : 12/341806
DATED : June 15, 2010
INVENTOR(S) : Faure et al.

It is certified that error appears in the above-identified patent and that said Letters Patent is hereby corrected as shown below:

Title Page:

Before Item (51), insert the following:

-- (30)  Foreign Application Priority Data
   Aug. 6, 2008   (EP) .............................. 08290758.5 --

Signed and Sealed this

Twenty-seventh Day of July, 2010

David J. Kappos
*Director of the United States Patent and Trademark Office*